United States Patent
Kato et al.

(10) Patent No.: US 9,460,973 B2
(45) Date of Patent: Oct. 4, 2016

(54) SURFACE PROCESSING PROGRESS MONITORING SYSTEM

(71) Applicant: SHIMADZU CORPORATION, Kyoto-shi, Kyoto (JP)

(72) Inventors: Rui Kato, Kyoto (JP); Yuzo Nagumo, Kizugawa (JP); Hiroomi Goto, Nara (JP)

(73) Assignee: SHIMADZU CORPORATION, Kyoto (JP)

(*) Notice: Subject to any disclaimer, the term of this patent is extended or adjusted under 35 U.S.C. 154(b) by 253 days.

(21) Appl. No.: 14/250,100

(22) Filed: Apr. 10, 2014

(65) Prior Publication Data
US 2014/0307262 A1    Oct. 16, 2014

(30) Foreign Application Priority Data
Apr. 12, 2013  (JP) .................................. 2013-084298

(51) Int. Cl.
| | | |
|---|---|---|
| *G01B 11/06* | (2006.01) | |
| *H01L 21/66* | (2006.01) | |
| *H01J 37/32* | (2006.01) | |

(52) U.S. Cl.
CPC ............ *H01L 22/12* (2013.01); *G01B 11/0633* (2013.01); *H01J 37/32972* (2013.01)

(58) Field of Classification Search
CPC .............. H01L 22/12; H01L 2924/00; H01L 2924/0002; H01L 22/20; H01L 22/34; H01L 21/67253; H01L 2924/00013; G01B 11/06; G01B 9/02083; G01B 9/02; G01B 9/02091; G01B 11/0633; G01B 2290/70; G01B 9/0209; G01B 11/2441; G01B 9/02021
USPC ........................ 356/451, 237.2, 237.5, 632; 257/E21.53, E21.525; 438/14, 16, 7
See application file for complete search history.

(56) References Cited

U.S. PATENT DOCUMENTS

| | | | | |
|---|---|---|---|---|
| 5,333,049 A * | 7/1994 | Ledger | ................... | G01B 11/06 356/504 |
| 5,555,472 A * | 9/1996 | Clapis | ................ | G01B 11/0625 356/504 |
| 5,717,490 A * | 2/1998 | Kumar | ............... | G01B 11/0625 356/630 |
| 5,729,343 A * | 3/1998 | Aiyer | ................. | G01B 11/0675 356/504 |
| 5,798,837 A * | 8/1998 | Aspnes | .............. | G01B 11/0641 356/369 |
| 5,982,496 A * | 11/1999 | Ziger | ................. | G01B 11/0633 250/341.1 |
| 6,999,180 B1 * | 2/2006 | Janik | .................. | G01B 11/2441 356/497 |
| 8,699,038 B2 * | 4/2014 | Schoenleber | .......... | B24B 49/12 356/237.2 |
| 8,741,741 B2 * | 6/2014 | Kuwabara | ......... | H01L 21/76251 257/E21.568 |
| 8,928,890 B2 * | 1/2015 | Nebosis | ............... | A61B 5/0066 356/497 |
| 8,954,186 B2 * | 2/2015 | Qian | ................... | G05B 23/0208 438/692 |
| 2002/0173084 A1 * | 11/2002 | Ohkawa | ............. | G01B 11/0625 438/149 |
| 2003/0090671 A1 * | 5/2003 | Takahashi | .............. | G01B 11/06 356/479 |
| 2004/0239946 A1 * | 12/2004 | Kane | ....................... | G01J 3/453 356/497 |
| 2008/0020495 A1 * | 1/2008 | Usui | ................. | H01J 37/32935 438/9 |

FOREIGN PATENT DOCUMENTS

JP             10-325708 A      12/1998

* cited by examiner

*Primary Examiner* — Tarifur Chowdhury
*Assistant Examiner* — Mohamed K Amara
(74) *Attorney, Agent, or Firm* — Sughrue Mion, PLLC

(57) ABSTRACT

A system including an index assigning section estimating the thickness of a thin film based on the intensity of light reflected on a substrate and a theoretical formula expressing a relationship between the thickness of the thin film and the intensity of an interference light when the spectrum is obtained for the first time, and assigning indexes for each candidate value for the layer thickness; a layer thickness wide-range estimating section estimating the layer thickness within the range of the value of a layer thickness wide-range estimation width including the previously estimated value of the layer thickness based on the theoretical formula; a selecting section selecting an index from the indexes; a determining section determining a layer thickness wide-range estimation result; and a layer thickness determining section determining the thickness of the thin film based on the theoretical formula after calculating the layer thickness wide-range estimation result.

7 Claims, 7 Drawing Sheets

(a)

(b)

SURFACE PROCESSING PROGRESS MONITORING SYSTEM

TECHNICAL FIELD

The present invention relates to a surface processing progress monitoring system, and more particularly, to a surface processing progress monitoring system for use to measure a temporal change in a continuously-changing thickness of a resist layer when micro-sized holes or grooves are formed by performing any type of etching process on a semiconductor substrate masked with the resist layer.

BACKGROUND ART

In the process of producing semiconductor integrated circuits, an etching process using low-pressure plasma or other plasma is performed to form micro-sized holes or grooves in a semiconductor substrate, such as a silicon wafer. In normal etching procedures, the area where no hole or groove should be created is initially masked with a resist layer on the substrate before the etching process. During the etching process, the areas where no resist mask is present are selectively etched. After this process is completed, the resist layer is removed to obtain a substrate having holes or grooves (hereinafter referred to as "holes or the like").

During the etching process, not only the areas where no resist mask is present, but also the resist layer in the masked areas may be etched to a decreased thickness, or the etched material may be deposited on the resist layer in the masked areas to increase the thickness of the resist layer. A temporal change in the thickness of the resist layer is thus monitored in real time during the etching process, and the obtained result is used as a criterion to determine whether the etching process is normally proceeding.

In one of the methods of monitoring the temporal change in the thickness of the resist layer, a light source with a broad wavelength range (a white light source) is used. In this method, a white light is cast onto the substrate whose surface is masked with a resist layer. The light reflected by the surface of the resist layer, and the light passing through the resist layer and reflected by the surface of the substrate are made to interfere in an interference optical system. The obtained interference light is wavelength-dispersed by a light-dispersing element, and detected by a CCD line sensor or the like to obtain wavelength-intensity characteristics.

When the white light is used, however, the light entering each sensor after the wavelength dispersion has a low intensity. Thus, it takes time to measure the thickness of the resist layer and the thickness of the resist layer cannot be measured in real time.

To solve the problem, the methods of performing real-time measurement by using a laser light source or a super luminescent diode (SLD) light source have been proposed. Patent Literature 1 discloses the method of casting a laser beam onto a substrate whose surface is masked with a resist layer to obtain an interference light in a similar manner to the previous manner, and monitoring a temporal change in the intensity of the interference light. Along with the progress of etching, a local maximum value and a local minimum value appear in the intensity of the interference light at each time when the layer thickness changes by one-quarter of the wavelength of the laser beam cast onto the substrate. Accordingly, in this method, the temporal change in the intensity of the interference light is monitored to measure the thickness of the resist layer or the depth of the hole or the like.

CITATION LIST

Patent Literature

[Patent Literature 1] JP H10-325708 A

SUMMARY OF INVENTION

Technical Problem

In the method according to Patent Literature 1, it is not until the turn-around (i.e. change to a reversed direction) of the intensity of the interference light is confirmed by constantly observing the change for a while that an occurrence of the local maximum value or the local minimum value (hereinafter collectively referred to as "extremal value") can be determined Thus, a time lag inevitably occurs between the timing at which the extremal value is actually detected and the timing at which the occurrence of the extremal value is determined. Also, the thickness of the resist layer or the depth of the hole or the like cannot be determined during a period from when the extremal value is determined to when the next extremal value is determined. The method according to Patent Literature 1 thus cannot measure the continuously-changing thickness of the resist layer in real time.

The objective of the present invention is to provide a surface processing progress monitoring system capable of measuring a temporal change in a continuously-changing thickness of a resist layer in real time when an etching process is performed on a substrate masked with the resist layer.

Solution to Problem

When a light is cast onto a substrate in the area masked with a resist layer during an etching process, two reflected lights are simultaneously obtained: one being reflected on the surface of the resist layer of the substrate, and one passing through the resist layer and being reflected on the surface of the substrate. The intensity $R_m(\lambda,t)$ of the interference light that is generated by the interference of the two reflected lights and is affected by the optical path difference between them is expressed by the following equation.

[Expression 1]

$$R_m(\lambda, t) = R_r(\lambda) \cdot \left( \alpha_1 + \alpha_2 \cdot \cos\left( \frac{2T(t) \cdot n(\lambda)}{\lambda} \cdot 2\pi \right) \right) \quad (1)$$

where $\lambda$ is the wavelength of measurement light, t is time, $R_r(\lambda)$ is the intensity of the light reflected on the surface of the substrate, $\alpha_1$ is the coefficient corresponding to the intensity of the light reflected on the surface of the substrate and the intensity of the light reflected on the surface of the resist layer, $\alpha_2$ is the coefficient corresponding to the intensity of the interference light, $T(t)$ is the layer thickness of the resist layer at time t, and $n(\lambda)$ is the refractive index of the material of the resist layer at the wavelength $\lambda$. Among these parameters, $\alpha_1$ and $\alpha_2$ change depending on the surface state of the resist layer or the layer thickness $T(t)$ of the resist layer. $R_r(\lambda)$ is obtained in advance by measuring the light reflected on the surface of the substrate with no resist layer thereon.

The important point in the above equation (1) is that the intensity $R_m(\lambda,t)$ of the interference light is expressed by the cosine function, which changes periodically corresponding to the layer thickness of the resist layer $T(t)$. The other terms than the cosine function or coefficients can be added or changed as appropriate according to the configuration of the measurement system (including the material of the resist layer, the substrate material, the lens, the optical filter, etc.) or measurement conditions (an occurrence of drift, etc.)

The present inventors have discovered that the layer thickness $T(t)$ of the resist layer can be measured in real time by detecting the intensity $R_m(\lambda,t)$ of the interference light at a predetermined time interval, comparing, in each time of detection, the detected intensity $R_r(\lambda,t)$ with the intensity $R_r(\lambda)$ of the light reflected on the substrate surface observed by a preliminary experiment or the like, and determining the values of $\alpha_1$, $\alpha_2$, and $T(t)$, respectively. The present invention was achieved through the discovery.

To achieve the above object, the present invention provides a surface processing progress monitoring system for measuring a thickness of a thin film formed on a substrate which increases or decreases during surface processing, including a light source, an interference optical system for generating interference light by making light reflected on a surface of the thin film and light reflected on a surface of the substrate interfere with each other, a dispersing device for wavelength-dispersing the interference light, and a measuring device for measuring, at each wavelength, an intensity of the interference light wavelength-dispersed by the dispersing device, the surface processing progress monitoring system further including:

a) a storing section for storing an initial thickness value of the thin film, a time change rate of the thickness of the thin film during the surface processing a layer thickness wide-range estimation width, a layer thickness wide-range estimation time interval for estimating the layer thickness by using the layer thickness wide-range estimation width, a layer thickness narrow-range estimation width narrower than the layer thickness wide-range estimation width, and a layer thickness narrow-range estimation time interval for estimating the layer thickness by using the layer thickness narrow-range estimation width;

b) a spectrum obtaining section for obtaining a spectrum of the interference light, using the measuring device, a predetermined number of times at a time interval equal to the layer thickness wide-range estimation time interval, and then obtaining a spectrum of the interference light at a time interval equal to the layer thickness narrow-range estimation time interval;

c) an index assigning section for estimating the thickness of the thin film within the range of the layer thickness wide-range estimation width including the initial thickness value based on a theoretical formula expressing a relationship between the thickness of the thin film and an intensity of the interference light when the spectrum obtaining section obtains a spectrum of the interference light for the first time, setting a plurality of candidate values for the layer thickness including the estimated value of the thickness of the thin film at a predetermined interval of length corresponding to a wavelength of the light source, and assigning an index for each of the candidate values for the layer thickness;

d) a layer thickness wide-range estimating section for estimating the thickness of the thin film within the range of the layer thickness wide-range estimation width including the value of the thickness of the thin film estimated previously at the time of obtaining a spectrum of the interference light based on the theoretical formula when the spectrum obtaining section obtains a spectrum of the interference light from a second time up to the predetermined number of times;

e) an index selecting section for selecting one index from a plurality of the indexes based on an index selected previously at the time of obtaining a spectrum of the interference light corresponding to a difference between a value of the thickness of the thin film estimated by the layer thickness wide-range estimating section and a value of the thickness of the thin film estimated previously at the time of obtaining a spectrum of the interference light by the layer thickness wide-range estimating section;

f) a layer thickness wide-range estimation result determining section for determining a layer thickness wide-range estimation result based on a result of the index selected at the predetermined number of times by the index selecting section and the time change rate of the thickness of the thin film; and g) a layer thickness determining section for determining the thickness of the thin film within a range of the layer thickness narrow-range estimation width including the value of the thickness of the thin film estimated previously at the time of obtaining a spectrum of the interference light based on the theoretical formula after determining the layer thickness wide-range estimation result.

The operation of the surface processing progress monitoring system according to the present invention is roughly divided into layer thickness wide-range estimation and layer thickness narrow-range estimation performed after the layer thickness wide-range estimation. When the operation enters the layer thickness narrow-range estimation, the layer thickness starts to be measured in real time. The real-time measurement is performed at a time interval equal to the layer thickness narrow-range estimation time interval. It is preferable, although not essential, to make the layer thickness narrow-range estimation time interval shorter than the layer thickness wide-range estimation time interval.

The predetermined number of times may be stored in the storing section in advance, or may be set as a number of times executed before a user issues an instruction to terminate the layer thickness wide-range estimation. Alternatively, the predetermined number of times may be set as a number of times executed before a time determined according to the conditions for executing the surface processing elapses.

In the layer thickness wide-range estimation, the layer thickness wide-range estimation result is determined by estimating the layer thickness as described below.

Firstly, when a spectrum of the interference light is obtained for the first time, the index assigning section estimates the thickness of the thin film within the range of the value of the layer thickness wide-range estimation width including the initial thickness value based on the intensity of the light reflected on the substrate surface and the theoretical formula expressing the relationship between the thickness of the thin film and the intensity of the interference light. For example, equation (1) may be employed as the theoretical formula expressing the relationship between the thickness of the thin film and the intensity of the interference light. More specifically, the values of $\alpha_1$, $\alpha_2$, and $T(t)$ are calculated by using a least squares method such that the calculation result of equation (1) becomes closest to the measured intensity $R_m(\lambda,t)$ of the interference light, and the thickness $T_1$ of the thin film can be estimated.

As described above, the technical idea of the present invention lies in the point that the thickness of the thin film is measured in real time during the surface processing based on the intensity of the light reflected on the substrate surface that can be previously obtained and the theoretical formula expressing the relationship between the thickness of the thin film and the spectrum of the interference light that is obtained by actual measurement. Therefore, a theoretical formula different from this theoretical formula, in which a coefficient or term is added or changed in consideration of the configuration or state of a measurement system, may be used based on the technical idea. The values of $\alpha_1$, $\alpha_2$, and $T(t)$ may also be determined by using a method other than the least squares method. Furthermore, the intensity of the light reflected on the surface of the substrate may be measured in advance and stored in the storing section, or obtained at the same time as obtaining the spectrum of the interference light.

As can be seen from equation (1), the cosine component is included in the right side of the intensity $R_m(\lambda,t)$ of the interference light. Thus, the intensity of the interference light periodically changes at each time the thickness $T(t)$ of the thin film changes by $\lambda/2n(\lambda)$, that is, at each time an optical path difference $2T(t)$ between the light reflected on the surface of the resist layer and the light passing through the resist layer and reflected on the surface of the substrate matches the integer multiple of the wavelength $\lambda/n(\lambda)$ of the measurement light. Therefore, the layer thickness wide-range estimation width is preferably set to $\lambda/n(\lambda)$, or more to obtain the local minimum of the sum of least squares at at least two points of the value of $T(t)$. Among the two points, the value of $T(t)$ at which the sum of least squares has a smaller value is employed as the first layer thickness estimated value $T_1$. The index assigning section assigns indexes respectively to discrete values which differ from $T_1$ by the integer multiple of $\lambda/n(\lambda)$.

When a spectrum of the interference light is obtained for the second and subsequent times, the layer thickness wide-range estimating section estimates the thickness of the thin film within the range of the layer thickness wide-range estimation width including the value of the thickness of the thin film estimated previously at the time of obtaining a spectrum of the interference light based on the above theoretical formula. To be more specific, for example, the layer thickness wide-range estimating section determines the values of $\alpha_1$, $\alpha_2$, and $T(t)$ by using the least squares method such that the calculation result of equation (1) becomes closest to the intensity $R_m(\lambda,t)$ of the measured interference light, and estimate the thickness $T_n$ of the thin film. The index selecting section compares the thickness $T_n$ of the thin film and the previously-estimated thickness $T_{n-1}$ of the thin film. The index selecting section selects one of the plurality of indexes based on the result. The index selecting section may be configured to select one index by using, for example, a floor function or a ceiling function.

When the obtaining of the spectrum of the interference light and the estimating of the layer thickness are conducted the predetermined number of times, the layer thickness wide-range estimation result determining section determines the layer thickness wide-range estimation result based on of the index selected at the predetermined number of times by the index selecting section and the time change rate of the thickness of the thin film. For example, the thickness of the thin film corresponding to the index selected most times is determined as a layer thickness wide-range estimation result. The layer thickness wide-range estimation is thereby completed.

After the layer thickness wide-range estimation is completed, the layer thickness determining section determines the thickness of the thin film within the range of the layer thickness narrow-range estimation width including the value of the thickness of the thin film estimated previously at the time of obtaining a spectrum of the interference light based on the layer thickness wide-range estimation result, and the intensity of the light reflected on the substrate surface, and the theoretical formula expressing the relationship between the thickness of the thin film and the intensity of the interference light. The layer thickness narrow-range estimation width is preferably set to less than $\lambda/n(\lambda)$, to obtain the local minimum of the sum of least squares at only one point of the value of $T(t)$, and the value $T(t)$ is determined as the layer thickness value. Since the layer thickness narrow-range estimation width is narrower than the layer thickness wide-range estimation width, the computation time of the layer thickness is shortened to achieve the layer thickness measurement in real time in the layer thickness narrow-range estimation.

Advantageous Effects of Invention

The surface processing progress monitoring system according to the present invention performs the layer thickness wide-range estimation and the layer thickness narrow-range estimation by using the intensity of the light reflected on the substrate surface, the theoretical formula expressing the relationship between the thickness of the thin film and the intensity of the interference light, and the spectrum of the interference light, regardless of the local maximum value or local minimum value of the intensity of the interference light. To be more specific, the accurate layer thickness value is determined in the layer thickness wide-range estimation, and the layer thickness is measured in real time in the subsequent layer thickness narrow-range estimation. Accordingly, the thickness of the thin film can be always measured in real time after the layer thickness narrow-range estimation is started.

DESCRIPTION OF EMBODIMENTS

A surface processing progress monitoring system according to one embodiment of the present invention is hereinafter described with reference to the drawings.

Figure 1:
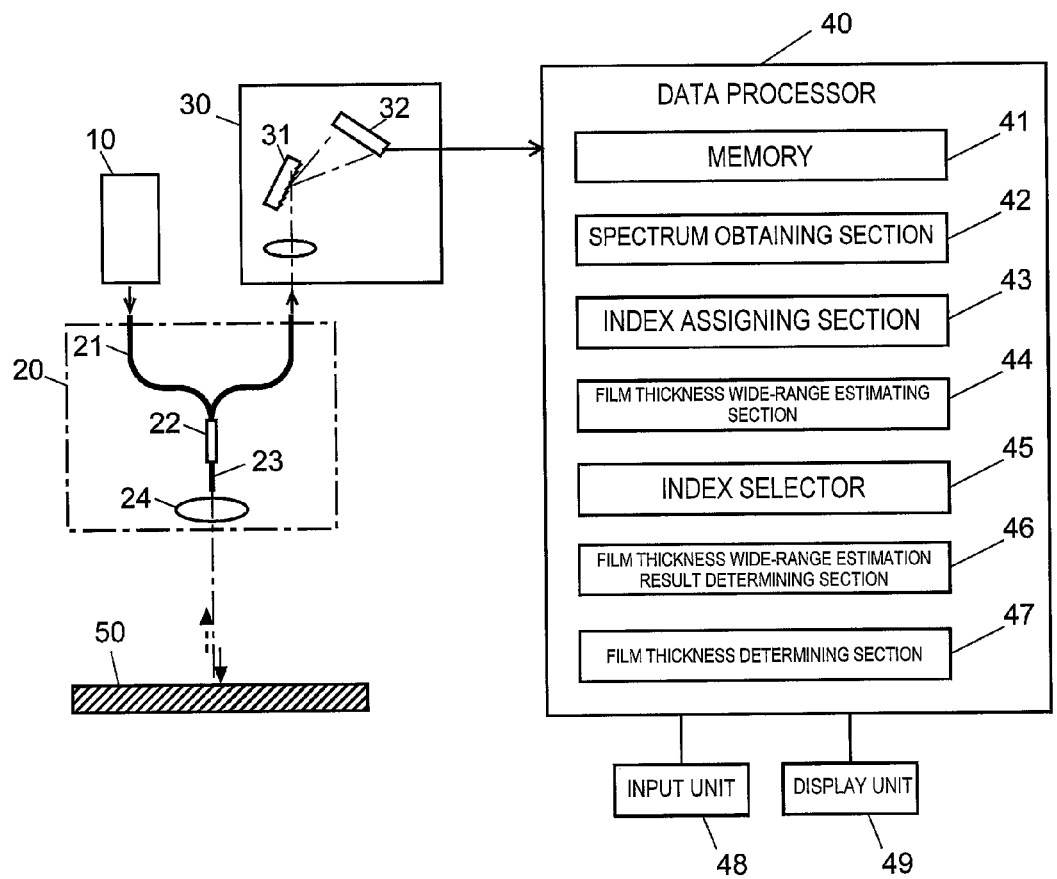
FIG. 1 is a configuration diagram of main portions of a surface processing progress monitoring system according to one embodiment of the present invention.

FIG. 1 is a schematic configuration diagram of a surface processing progress monitoring system of the present embodiment. The present surface processing progress monitoring system is used for monitoring a continuously-changing resist thickness or substrate thickness of a sample 50 being processed by a plasma etching device or a substrate grinding device, etc. The surface processing progress monitoring system of the present embodiment includes a light source 10, a measurement optical system 20, a light-dispersing unit 30 and a data processor 40. The light source 10 and the measurement optical system 20, as well as the measurement optical system 20 and the light-dispersing unit 30, are connected via optical fibers. The configurations of these units are sequentially described below.

The light source 10 of the present embodiment is an SLD light source having a central wavelength of 830 nm and a full width at half maximum of 15 nm. A beam of measurement light emitted from the light source 10 is introduced into an incident optical fiber 21 of the measurement optical system 20, passes through a fiber coupler 22 and through an optical fiber 23, and is eventually emitted from the tip of the optical fiber 23.

The light emitted from the end of the optical fiber 23 is cast onto the sample 50 through a collimator lens 24.

Figure 2:
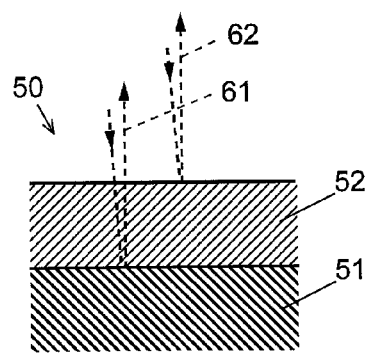
FIG. 2 is a schematic diagram of a light reflected on the surface of a resist layer and a light passing through the resist layer and reflected on the surface of a substrate in the surface processing progress monitoring system of the present embodiment.

A state of the interference that occurs on the surface of the sample 50 is hereinafter described by means of FIG. 2. The sample 50 of the present embodiment is obtained by forming a resist layer 52 on the surface of a substrate 51. The thickness of the resist layer 52 continuously decreases with the progress of etching. The sample 50 is not limited to this example. Any sample may be employed as long as the thickness of the film formed on the surface of the substrate or the like continuously changes. For example, a sample where a film is deposited on the surface of the substrate 51, i.e., a sample where the layer thickness continuously increases may also be employed.

A light 62 reflected on the surface of the resist layer 52, and a light 61 passing through the resist layer 52 and reflected on the surface of the substrate 51 pass through the collimator lens 24 in the direction opposite to the previous direction of the light cast onto the sample 50, enter the optical fiber 23, pass through the fiber coupler 22, and reach the light-dispersing unit 30. While passing through the optical fiber 23, the lights 61 and 62 interfere with each other, to be interference light before reaching the light-dispersing unit 30.

In the light-dispersing unit 30, the interference light is wavelength-dispersed by a diffraction grating 31, and the components of light having different wavelengths are simultaneously detected by a CCD line sensor 32. The CCD line sensor 32 produces detection signals respectively corresponding to the different wavelengths and noises are eliminated from the signals by a noise filter (not shown), and the obtained signals are sent to the data processor 40.

The data processor 40 includes, as its functional blocks, a memory 41, a spectrum obtaining section 42, an index assigning section 43, a layer thickness wide-range estimating section 44, an index selector 45, a layer thickness wide-range estimation result determining section 46, and a layer thickness determining section 47. The data processor 40 is actually a personal computer with a previously-installed data processing software program. Executing this program enables the computer to function as the data processor 40. An input unit 48 and a display unit 49 are also connected to the computer.

Figure 3:
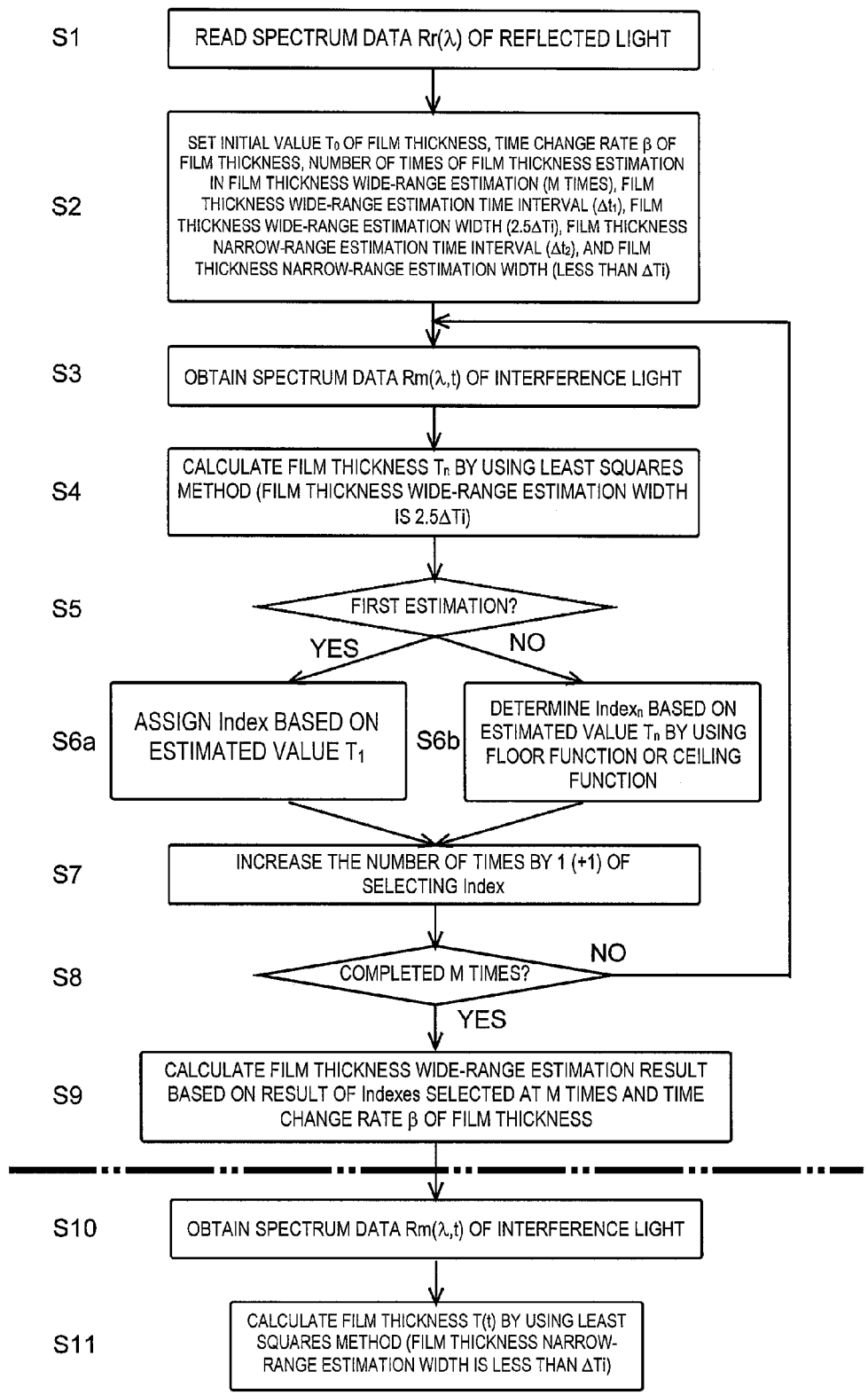
FIG. 3 is a flowchart for explaining the operation flow of the surface processing progress monitoring system of the present embodiment.

The operation of the surface processing progress monitoring system of the present embodiment is hereinafter described with reference to FIG. 1 and FIG. 3. FIG. 3 is a flowchart of the operation of the surface processing progress monitoring system of the present embodiment.

Spectrum data $R_r(\lambda)$ of the light reflected on the surface of the substrate with no resist layer 52 formed thereon is obtained in advance. The spectrum data $R_r(\lambda)$ is read and stored in the memory 41 (Step S1). A dark signal of the CCD line sensor 32 has been already subtracted from the spectrum data $R_r(\lambda)$. An initial thickness $T_0$ of the resist layer, a time change rate β of the layer thickness, a number of times of layer thickness estimation in the layer thickness wide-range estimation (M times, 200 times in the present embodiment), a layer thickness wide-range estimation time interval ($\Delta t_1$, 0.5 sec in the present embodiment), a layer thickness wide-range estimation width ($2.5\Delta T_i$), a layer thickness narrow-range estimation time interval ($\Delta t_2$, 0.05 sec in the present embodiment), a layer thickness narrow-range estimation width (less than $\Delta T_i$) and index (a total of 33 from 0 to 32 in the present embodiment) are also set in advance, and stored in the memory 41 (Step S2).

It is normally difficult to accurately capture the actual layer thickness of the resist layer on the substrate surface. Therefore, the initial thickness $T_0$ of the resist layer set in advance is a value estimated at the start of an etching process. Even when the actual layer thickness cannot be accurately captured at the start of an etching process, the surface processing progress monitoring system of the present embodiment can accurately monitor the layer thickness in real time after a lapse of a predetermined time as described later in Example 2.

The layer thickness wide-range estimation time interval $\Delta t_1$ is set based on a predicted maximum value βmax [μm/sec] of the change in the thickness of the resist layer per unit time such that βmax×$\Delta t_1$ is sufficiently smaller than $\Delta T_i$. The layer thickness narrow-range estimation time interval $\Delta t_2$ is set based on the predicted maximum value βmax [μm/sec] of the change in the thickness of the resist layer per unit time such that βmax×$\Delta t_2$ is sufficiently smaller than ½×$\Delta T_i$.

The above set values will be described in more detail later.

As described above, the surface processing progress monitoring system of the present embodiment first performs the layer thickness wide-range estimation, and then performs the layer thickness narrow-range estimation. The layer thickness wide-range estimation and the layer thickness narrow-range estimation are hereinafter sequentially described.

1. Layer Thickness Wide-Range Estimation

Firstly, the spectrum obtaining section 42 obtains a first spectrum $R_m(\lambda,t)$ of the interference light (Step S3). The index assigning section 43 compares the spectrum $R_m(\lambda,t)$ of the interference light with the spectrum $R_r(\lambda)$ of the light reflected on the surface of the substrate stored in the memory 41 to calculate a first estimated value of the layer thickness (Step S4). To be more specific, $\alpha_1$ (the coefficient corresponding to the intensities of the reflected lights), $\alpha_2$ (the coefficient corresponding to the intensity of the interference light), and $T_1$ are calculated by a least squares method using the following equation (2) based on the theoretical formula in equation (1), that is, such that σ has a minimum value (Step S4). In the following equation, FitStart and FitEnd are respectively the numbers of the elements of the CCD line sensor 32 (1 to 1024), InputSignal is the value of the signal intensity obtained from each element of the CCD line sensor 32, DarkSignal is the value of the dark signal of the CCD line sensor 32 described above, and FitSignal is the value calculated by the index assigning section 43.

[Expression 2]

$$\sigma = \sum_{n=FitStart}^{FitEnd} \{(InputSignal_n - DarkSignal_n) - FitSignal_n\}^2 \quad (2)$$

Figure 4:
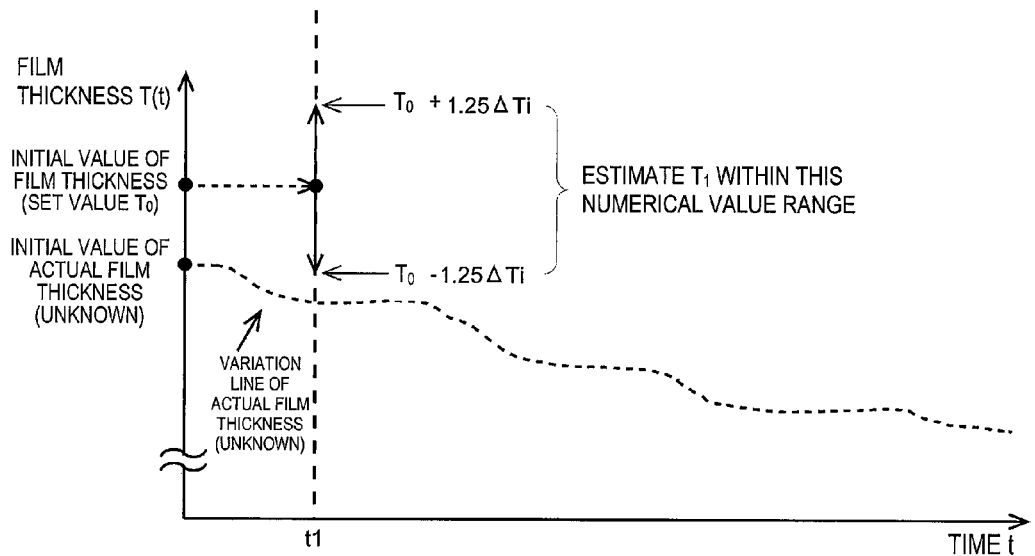
FIG. 4 is a graph for explaining a method of first-time layer thickness estimation in the present embodiment.

When the index assigning section 43 calculates $T_1$, the estimated value is ranging from $T_0-1.25\,\Delta T_i$ to $T_0+1.25\,\Delta T_i$. That is, the estimated value is within the range of the layer thickness wide-range estimation width $2.5\Delta T_i$ centered on the initial thickness $T_0$ of the resist layer (see FIG. 4). In the present embodiment, $\Delta T_i$ is the value calculated by the following equation (3).

[Expression 3]

$$\Delta T_i \cong \frac{\lambda_c}{2 \cdot n(\lambda_c)} [\mu m] = \frac{0.83}{2 \cdot 1.4} \cong 0.296428\ldots [\mu m] \quad (3)$$

In the above equation, is the center wavelength of the SLD light source (the center wavelength of the measurement light), and $n(\lambda_c)$ is the refractive index of the material of the resist layer at the wavelength $\lambda_c$. As already described in relation to equation (1), the cosine component is included in the right side of the intensity $R_m(\lambda,t)$ of the interference light. Thus, the intensity of the interference light periodically changes at each time an optical path difference $2T(t)$ between the light reflected on the surface of the resist layer and the light reflected on the surface of the substrate matches the integer multiple of the wavelength $\lambda_c/n(\lambda_c)$ of the measurement light on the refractive index $n(\lambda_c)$. Therefore, the intensity of the interference light periodically changes at each time the layer thickness $T(t)$ changes by $\lambda_c/2n(\lambda_c)$. Accordingly, the value σ of the sum of least squares calculated by equation (2) changes as shown in FIG. 5.

Figure 5:
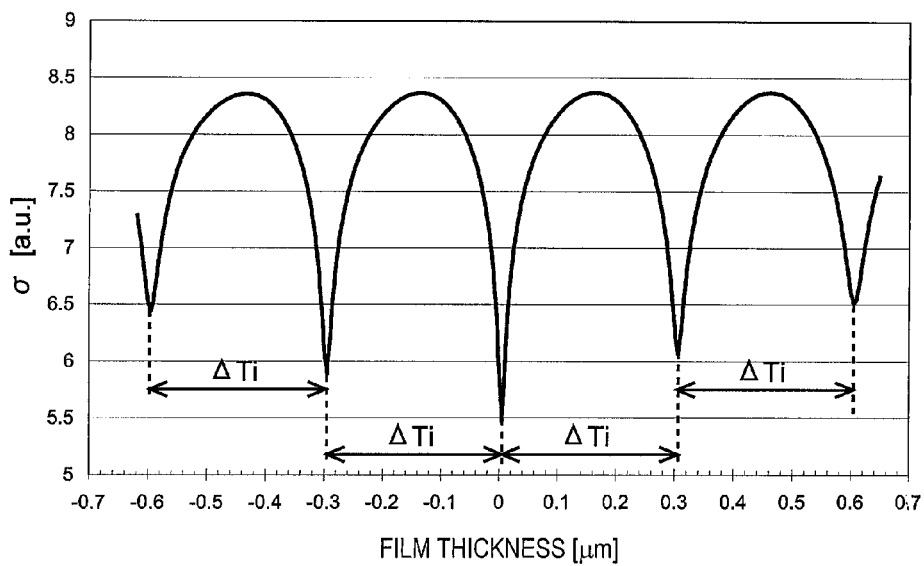
FIG. 5 is a graph for explaining a periodical variation in the sum of least squares.

As can be seen from FIG. 5, when the layer thickness wide-range estimation width is set to a value equal to or more than $2\Delta T_i$, the local minimum value of σ appears at at least two points of the value of $T_1$. Then, a more appropriate value (that is, a value at which u has a smaller value) can be employed as $T_1$. Therefore, the layer thickness wide-range estimation width may be set to be $2\Delta T_i$ or more. When the layer thickness wide-range estimation width is set to be a large value, the number of local minimum values of σ within the layer thickness wide-range estimation width can be increased. However, a time required for calculating $\alpha_1, \alpha_2,$ and $T_1$ is also increased. Therefore, the layer thickness wide-range estimation width may be set to be an appropriate value by considering the balance between them.

In the present embodiment, the center wavelength $\lambda_c$ of the light source is 830 nm, and the refractive index of the material of the resist layer at this wavelength is 1.4. Thus, $\Delta T_i = \lambda_c/2n(\lambda_c)$ is the value shown in the above equation.

Figure 6:
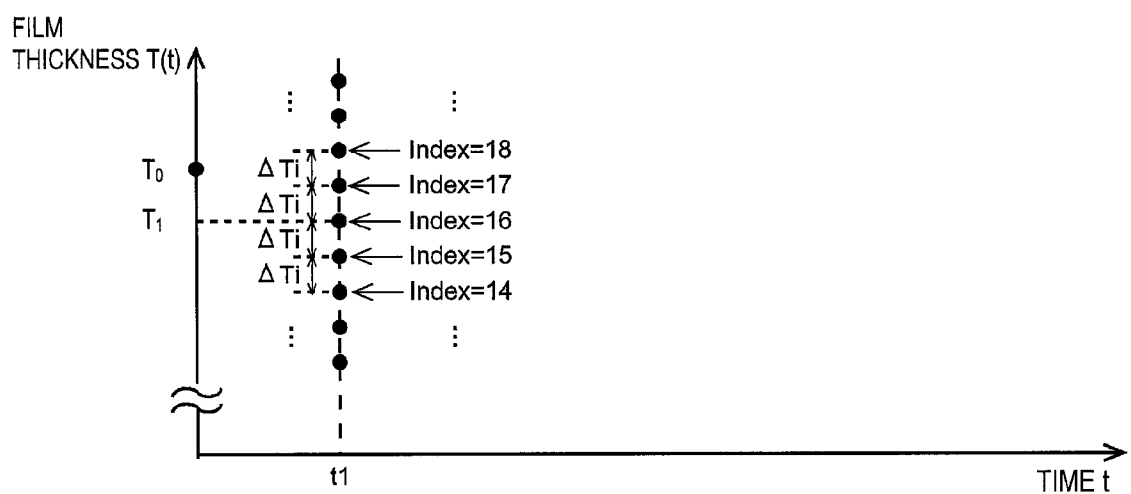
FIG. 6 is a graph for explaining an index assigning method in the present embodiment.

When the calculation of the value of $T_1$ is completed, it is determined whether or not this is the first layer thickness estimation (Step S5). When the result is YES, the index assigning section assigns Index=16 (the center value of Index set in the memory 41) to the estimated value of $T_1$ based on the above indexes (Step S6a). In detail, the index assigning section 43 sequentially assigns Index=0 to 15 to values which decrease from $T_1$ by $\Delta T_i$, and Index=17 to 32 to values which increase from $T_1$ by $\Delta T_i$, respectively, as shown in FIG. 6.

Subsequently, the spectrum obtaining section 42 obtains a second spectrum of the interference light (Step S3). The layer thickness wide-range estimating section 44 calculates $\alpha_1$ (the coefficient corresponding to the intensity of the reflected light), $\alpha_2$ (the coefficient corresponding to the intensity of the interference light), and $T_n$ (n is an integer from 2 to M) by the least squares method using equation (2) based on the theoretical formula in equation (1), that is, such that σ has a minimum value (Step S4) similarly to the obtaining of the first spectrum of the interference light. When the spectrum of the interference light is obtained for the second and subsequent times, the estimated value in the calculation of $T_n$ is ranging from $T_{n-1}-1.25\Delta T_i$ to $T_{n-1}+1.25\Delta T_i$. That is, the candidate value is within the range of the layer thickness wide-range estimation width $2.5\Delta T_i$ centered on the estimated layer thickness value $T_{n-1}$ obtained when the spectrum of the interference light is previously obtained. In the present embodiment, the layer thickness wide-range estimation width is set to be $2.5\Delta T_i$. Therefore, the local minimum value of the sum of least squares σ calculated by equation (2) appears at two points (or three points) of the value of T(t) in the layer thickness estimation at each time, and then more appropriate estimated value T(t) can be employed as $T_n$.

When the calculation of the value of $T_n$ is completed, it is determined whether or not this is the first layer thickness estimation (Step S5). When the result is NO, the index selector 45 compares the values of $T_n$ (the current estimated value) and $T_{n-1}$ (the previous estimated value) to determine which is larger, and then the index selector 45 selects the index corresponding to the current estimated value $T_n$ (Step S6b). The details are as follows.

In the case of $T_n \geq T_{n-1}$ (when the current estimated value increases from the previous estimated value), the index (a candidate value for the layer thickness) corresponding to the estimated layer thickness is selected by using the following equation (4) involving a floor function (the second term of the right side). That is, when the estimated value increases by a certain value or more, the value of Index to be selected is increased, and the Index corresponding to the estimated value $T_n$ is selected. The number of times of selecting Index is also increased (+1).

[Expression 4]

$$Index_n = Index_{n-1} + \left\lfloor \frac{T_n - T_{n-1}}{\Delta T_i} + Index_{coef} \right\rfloor \quad (4)$$

In the case of $T_n < T_{n-1}$ (when the estimated value decreases), the index (a candidate value for the layer thickness) corresponding to the estimated layer thickness is selected by using the following equation (5) involving a ceiling function (the second term of the right side). That is, when the estimated value decreases by a certain value or more, the value of Index to be selected is decreased, and the Index corresponding to the estimated value $T_n$ is selected. The selected number of times of the selecting of Index value is also increased (+1).

[Expression 5]

$$Index_n = Index_{n-1} + \left[\frac{T_n - T_{n-1}}{\Delta T_i} + Index_{coef}\right] \quad (5)$$

In equations (4) and (5), $Index_{coef}$ is the correction value, which is determined as appropriate in consideration of the layer thickness wide-range estimation time interval $\Delta t_1$ and the time change rate $\beta$ of the layer thickness. The value of $Index_{coef}$ in the present embodiment is 50% of $(\beta \times \Delta t_1)/\Delta T_i$.

It is previously described that a time interval equal to the layer thickness wide-range estimation time interval $\Delta t_1$ is set such that $\beta \times \Delta t_1$ is sufficiently smaller than $\Delta T_i$. This is because the value of the time change rate $\beta$ of the layer thickness sometimes changes during an actual etching process. The time change rate $\beta$ during etching may temporally change along with a change of state in the resist surface. If the layer thickness wide-range estimation time interval $\Delta t_1$ is set too large, an error between a time change rate $\beta_0$ of the actual layer thickness and $\beta$ set as the initial value, which is calculated as $|\beta_0 - \beta| \times \Delta t_1$, becomes large. As a result, the $Index_n$ selected by the index selector 45 differs at each time due to the temporal change in the time change rate $\beta_0$ of the actual layer thickness, and then the accuracy of the selected index deteriorates. To avoid this problem, the layer thickness wide-range estimation time interval $\Delta t_1$ is set such that $\beta \times \Delta t_1$ is sufficiently smaller than $\Delta T_i$.

Preferably, the layer thickness wide-range estimation time interval $\Delta t_1$ is set to be sufficiently small such that the change in the layer thickness through the time interval $\Delta t_1$ is sufficiently smaller than $\Delta T_i$. Then, $Index_n$ can be determined without considering the temporal change in the time change rate $\beta_0$ of the actual layer thickness. That is, the following equation (6) where the correction value $Index_{coef}$ in equation (4) is made 0 is obtained. Of course, the same applies to the correction value $Index_{coef}$ in equation (5).

[Expression 6]

$$Index_n = Index_{n-1} + \left[\frac{T_n - T_{n-1}}{\Delta T_i}\right] \quad (6)$$

After selecting the index by the index selector 45 is completed, the aforementioned steps including the obtaining of the spectrum data of the interference light by the spectrum obtaining section 42 (Step S3), the calculation of the layer thickness estimated value by the layer thickness wide-range estimating section 44 (Step S4), and the index selection by the index selector 45 (Step S6b) are repeated as a loop. The index selector 45 determines whether or not the loop has been conducted the predetermined number of times (M times) (Step S8). When the loop has not been conducted M times, the steps from the obtaining of the spectrum data of the interference light (Step S3) to the increment of the number of times of selecting the index (Step S7) are repeated.

When the above steps have been conducted M times, the layer thickness wide-range estimation result determining section 46 determines one index from the plurality of indexes (0 to 32) based on a result of the index selected at the predetermined number of times (M times) by the index selector 45. In the present embodiment, the index selected most by the index selector 45 is employed as a layer thickness variation line. The method of selecting the layer thickness variation line is not limited to this method, and various methods, such as a method of determining the layer thickness variation line based on a result of of a plurality of indexes selected most recently may be employed. Then the layer thickness wide-range estimation result is calculated according to the following equation (7) (Step S9):

[Expression 7]

$$T = T_M + (Index_{max} - Index_M) \times \Delta T_i + \beta \times \Delta t \quad (7)$$

where $T_M$ is the layer thickness wide-range estimated value obtained when the spectrum of the interference light is obtained at the M-th time, $Index_{max}$ is the value of index selected most as the result of selecting the index at M times, $Index_M$ is selected when the spectrum of the interference light is obtained at the M-th time, and $\Delta t$ is the elapsed time after the spectrum of the interference light is obtained for the M-th time. The layer thickness wide-range estimation is terminated when the layer thickness wide-range estimation result determining section 46 determines T according to equation (7).

2. Layer Thickness Narrow-Range Estimation

Subsequently, the layer thickness narrow-range estimation is described. In the layer thickness wide-range estimation, the spectrum obtaining section 42 obtains the spectrum $R_m(\lambda,t)$ of the interference light at a time interval equal to the layer thickness narrow-range estimation time interval $\Delta t_2$ (Step S10).

The layer thickness narrow-range estimation time interval $\Delta t_2$ is set such that $\beta max \times \Delta t_2$ is sufficiently smaller than $\frac{1}{2} \times \Delta T_i$ based on the predicted maximum value $\beta max$ of the change in the thickness of the resist layer per unit time. This is because that the change in the layer thickness through the layer thickness narrow-range estimation time interval $\Delta t_2$ is surely less than the layer thickness narrow-range estimation width $\Delta T_i$.

When the interference spectrum is obtained by the spectrum obtaining section 42, the layer thickness determining section 47 calculates $\alpha_1$ (the coefficient corresponding to the intensities of the reflected lights), $\alpha_2$ (the coefficient corresponding to the intensity of the interference light), and $T(t)$ by the least squares method using the above equation (2) based on the theoretical formula in the above equation (1) (Step S11). However, unlike in the layer thickness calculation by the layer thickness wide-range estimating section 44, the estimated value in the first calculation of $T(t)$ is within the range of more than $T - \frac{1}{2} \times \Delta T_i$ to less than $T + \frac{1}{2} \times \Delta T_i$. The estimated value in the second and subsequent calculations of $T(t)$ by the layer thickness determining section 47 is within the range of less than $\Delta T_i$ centered on the previously-calculated value. That is, the estimated value is within the range of less than the layer thickness narrow-range estimation width $\Delta T_i$ centered on the estimated layer thickness value $T_{n-1}$ obtained when the spectrum of the interference light is previously obtained.

Since the layer thickness narrow-range estimation width (less than $\Delta T_i$) is smaller than the layer thickness wide-range estimation width ($2.5 \Delta T_i$), the calculation amount in the calculation for the layer thickness estimation is reduced. As can be seen from FIG. 5 that has been already explained, when the layer thickness narrow-range estimation width is set to be less than $\Delta T_i$, the local minimum value of $\sigma$ appears at only one point of the value of T. Therefore, the layer thickness can be calculated at higher speed than the layer thickness estimation by the layer thickness wide-range estimating section 44, and the value of the layer thickness can be determined in real time.

Example 1

Figure 7A:
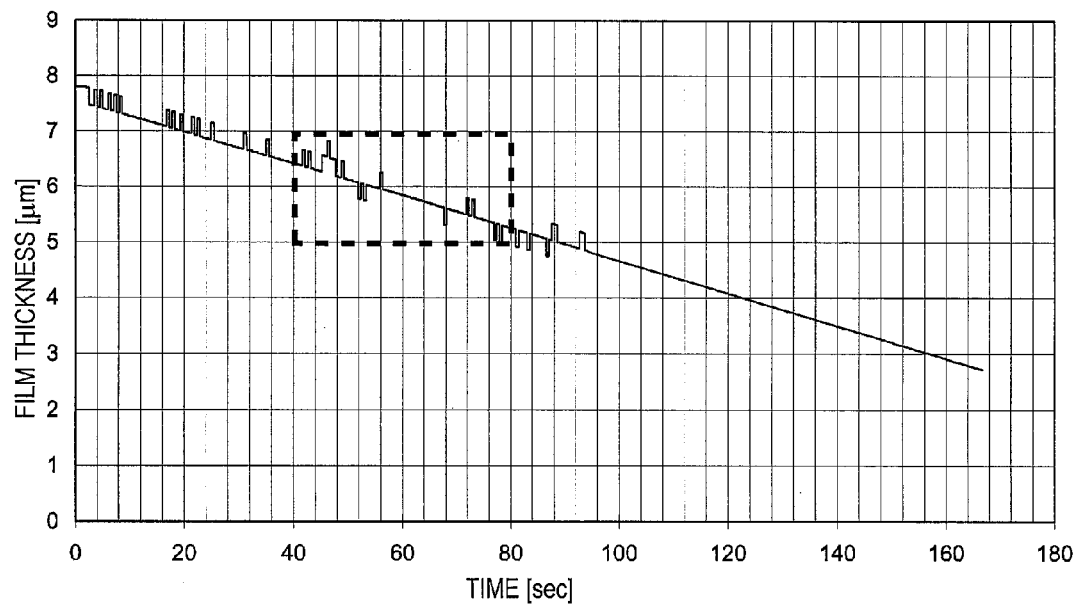
FIG. 7A and FIG. 7B show the result of measuring the thickness of a resist layer by the surface processing progress monitoring system of the present embodiment.
Figure 7B:
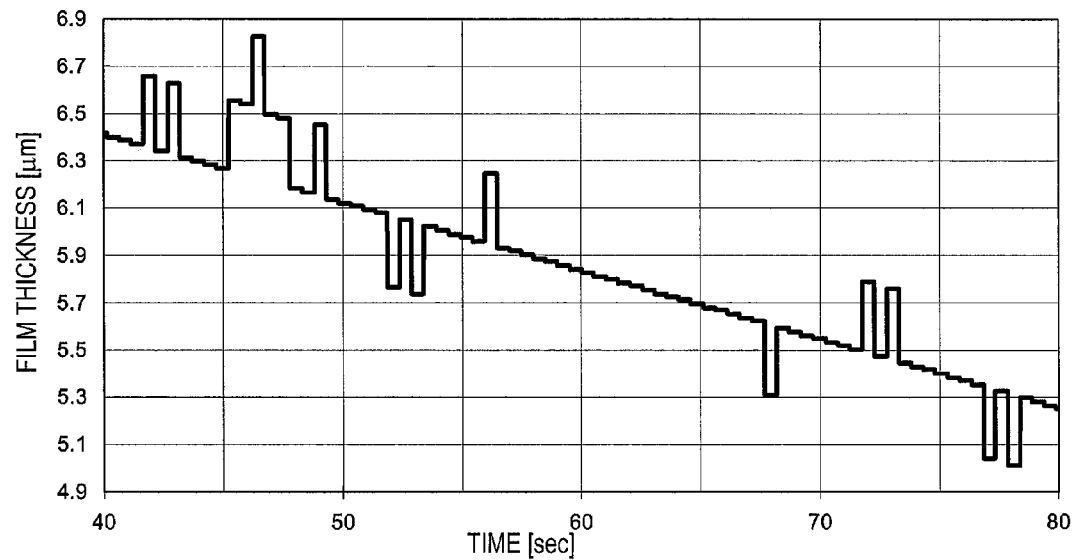

The temporal change in the thickness of the resist layer was measured by the surface processing progress monitoring system of the present embodiment. The result is shown in FIG. 7A and FIG. 7B. FIG. 7A and FIG. 7B show only the transition of the selected index without displaying the plurality of indexes for the purpose of simplifying the drawings. FIG. 7A is a general view of the layer thickness wide-range estimation result and the layer thickness narrow-range estimation result (real-time measurement), and FIG. 7B is an enlarged view of the area surrounded by the dashed line in FIG. 7A. In the present embodiment, the layer thickness wide-range estimation time interval $\Delta t_1$ is 0.5 sec, and the number of times of layer thickness estimation in the layer thickness wide-range estimation is 200. Thus, the layer thickness wide-range estimation result is calculated after a lapse of 100 seconds from the start of the layer thickness wide-range estimation. As can be seen from FIG. 7A, there is a distinct difference in the selected number of times of the index after the lapse of 100 seconds from the start. Thus, it is understood that the correct index can be uniquely selected. The process then enters the layer thickness narrow-range estimation. The layer thickness determining section 47 accurately measures the layer thickness in real time at each layer thickness narrow-range estimation time interval $\Delta t_2$ (0.05 sec).

Example 2

Figure 8A:
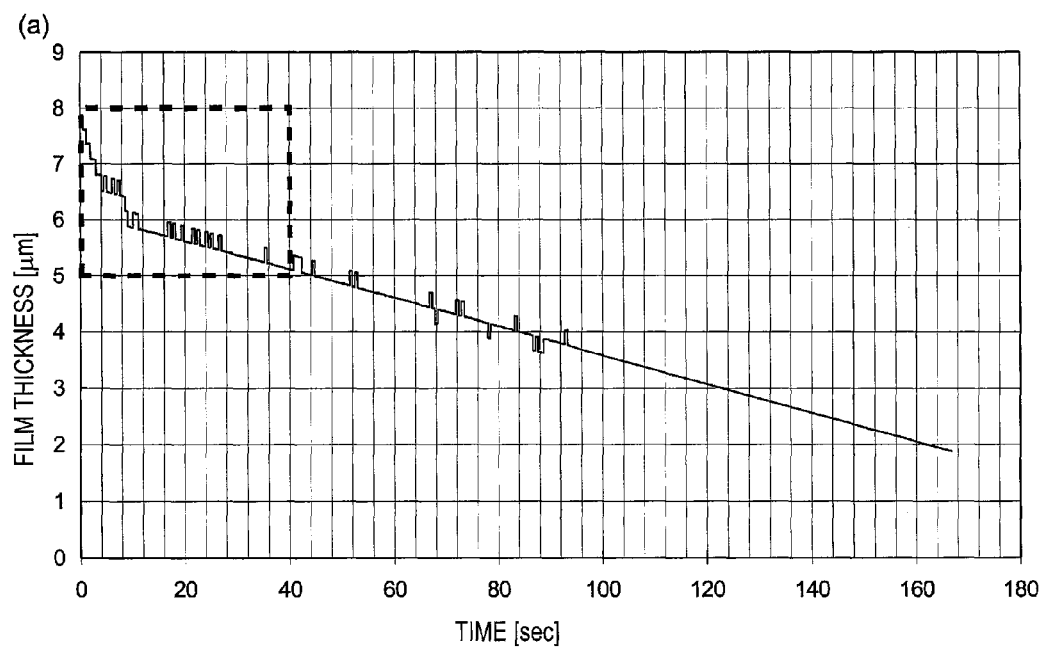
FIG. 8A and FIG. 8B show another result of measuring the thickness of a resist layer by the surface processing progress monitoring system of the present embodiment.
Figure 8B:
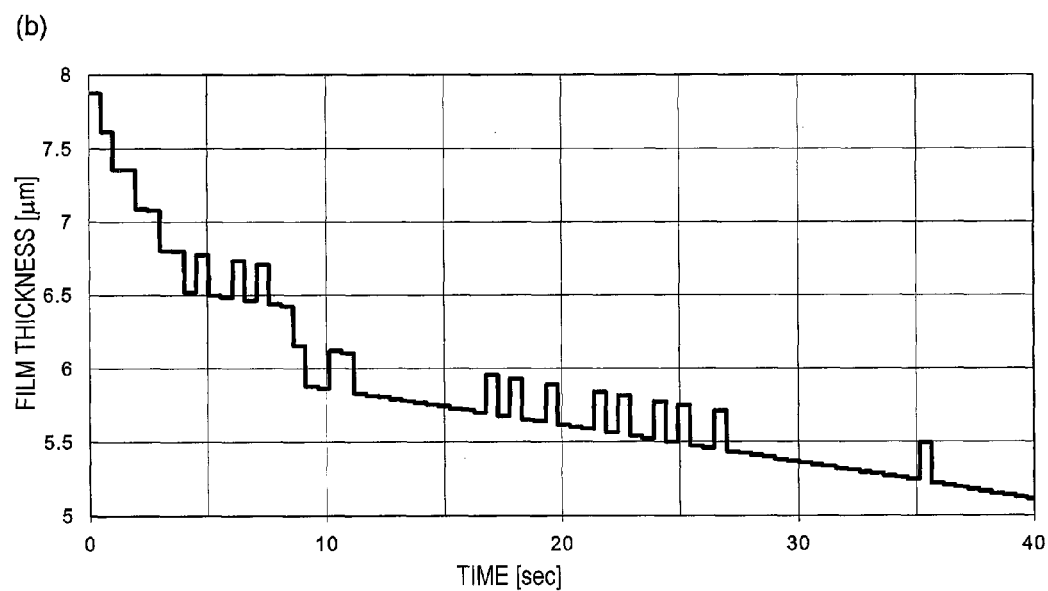

As described above, the initial value of the layer thickness previously set in the memory 41 may be different from the actual initial value of the layer thickness. It has been verified that the correct layer thickness can be measured in real time by using the surface processing progress monitoring system of the present embodiment even in such a case. The result is shown in FIGS. 8A and 8B. More specifically, a case in which the initial value of the layer thickness is set to be larger than the actual layer thickness was assumed. The result is shown in FIG. 8A and FIG. 8B. FIG. 8A is a general view of a result of the layer thickness measurement, and FIG. 8B is an enlarged view of the area surrounded by the dashed line in FIG. 8A. FIG. 8A and FIG. 8B also show only the transition of the selected index of the estimated layer thickness, as in FIG. 7. As can be seen from FIG. 8A and FIG. 8B, there is a distinct difference in the selected number of times of the index after a lapse of 100 seconds (at the point after the index is selected the predetermined number of times) from the start of the layer thickness wide-range estimation. Thus, it is understood that the correct index can be uniquely selected. That is, by using the surface processing progress monitoring system of the present embodiment, the correct layer thickness is calculated at the point at which the layer thickness wide-range estimation result is calculated even when the initial value is different from the actual value. Therefore, the layer thickness can be accurately measured in real time in the subsequent layer thickness narrow-range estimation.

The above embodiment is merely one example, and can be changed as appropriate according to the scope of the present invention.

Although the case in which the various parameters are set in advance in the memory 41 has been described in the above embodiment, a user may input these values at each time an etching process is performed. In this case, preferably, it is checked whether the product of the time change rate β of the layer thickness and the layer thickness wide-range estimation time interval $\Delta t_1$ is sufficiently smaller than $\Delta T_i$, and whether the product of the time change rate β of the layer thickness and the layer thickness narrow-range estimation time interval $\Delta t_2$ is less than $\frac{1}{2} \times \Delta T_i$. When one of these conditions is not satisfied, it is desirable that a warning for instructing a user to reset $\Delta t_1$ and $\Delta t_2$ is displayed on the screen of the display unit 49.

Figure 9:
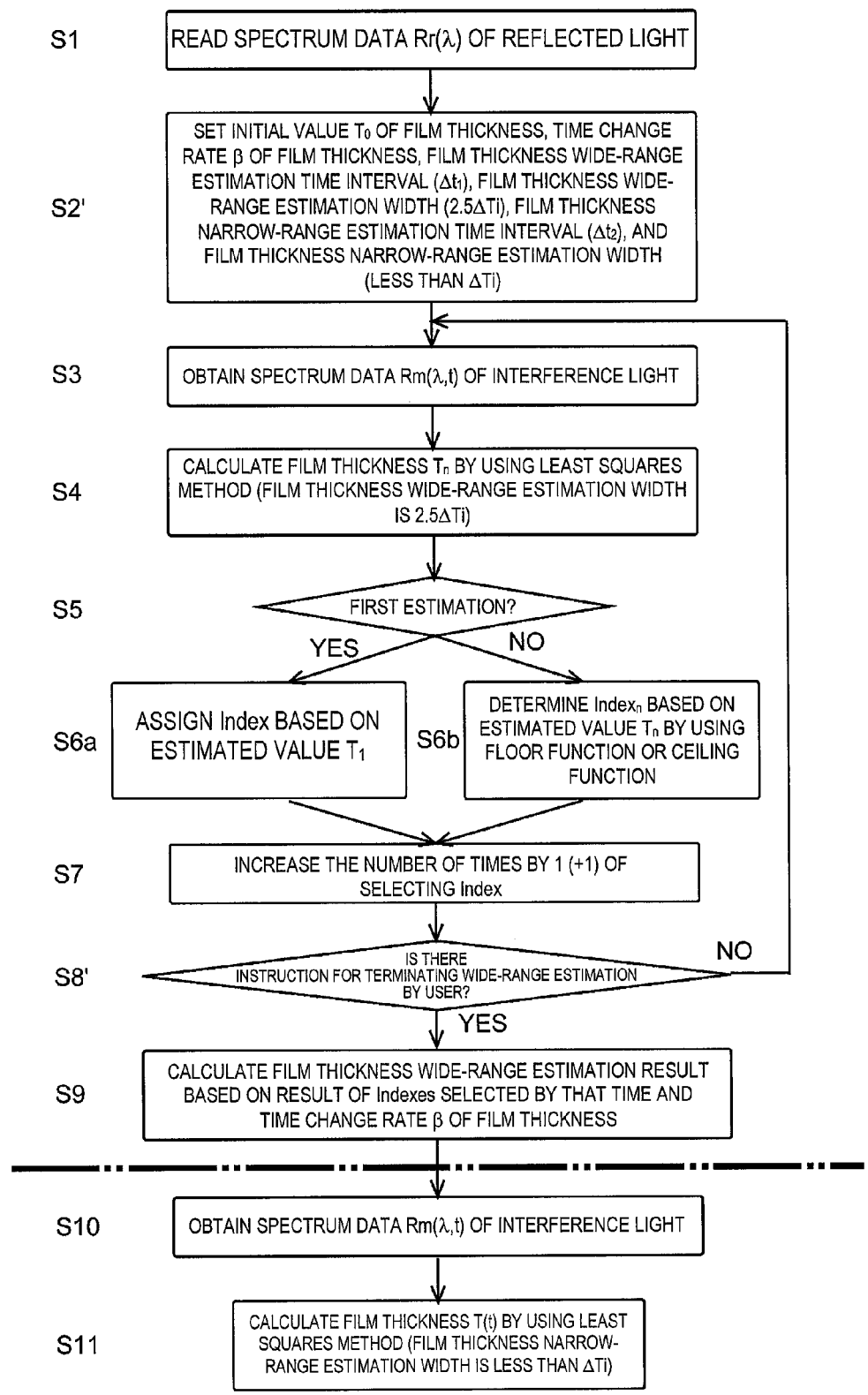
FIG. 9 is a flowchart for explaining the operation flow of the surface processing progress monitoring system according to a modification of the present invention.

In the above embodiment, the number of times of layer thickness estimation in the layer thickness wide-range estimation M is set in advance, and when the layer thickness wide-range estimation is completed this number of times, the layer thickness determining section 47 starts the real-time measurement of the layer thickness (that is, the process starts the layer thickness narrow-range estimation). However, a user may check the index selection results by the index selector 45 without setting the layer thickness wide-range estimation number of times M in advance. When determining that a significant difference is generated in the selected number of times and the index can be thereby uniquely selected, the user may instruct the layer thickness wide-range estimation result determining section 46 to determine the layer thickness wide-range estimation result, and the layer thickness determining section 47 to start the real-time measurement of the layer thickness. The operation flow of the surface processing progress monitoring system in this case is shown in FIG. 9. Unlike in the flowchart (FIG. 3) of the above embodiment, the number of times of layer thickness estimation in the layer thickness wide-range estimation is not set in advance (Step S2'), and when an instruction for terminating the wide-range estimation is issued from a user (YES in Step S8'), the layer thickness wide-range estimation result is determined (Step S9). Alternatively, the number of times of layer thickness estimation in the layer thickness wide-range estimation may be set to be a number of times executed before a time determined according to the conditions for executing the surface processing elapses.

Moreover, in the above embodiment, the layer thickness wide-range estimation result determining section 46 calculates the layer thickness wide-range estimation result by using the equation (7). However, the time change rate β in the equation (7) may be changed to a corrected time change rate β' corrected based on the M-time layer thickness wide range-estimation results. When the layer thickness wide-range estimation result is determined, the correct temporal change in the layer thickness up to the point of time is known. The corrected time change rate β' can be obtained by using the temporal change. This configuration is effectively employed when the initially-set time change rate β has a large temporal change or when the initially-set value has an error (it is difficult to correctly estimate the time change rate at the start of etching).

Although the candidate value in the calculation of $T_1$ is ranging from $T_0 - \Delta T_i$ to $T_0 + \Delta T_i$ when the index assigning section 43 or the like estimates the layer thickness, $T_0$ may not necessarily be set as the center value of the estimated value of the layer thickness. The same applies to the setting of the range of the estimated value of the layer thickness in the layer thickness estimation by the layer thickness wide range estimating section 44 and the layer thickness determining section 47.

The components, such as the SLD light source, the diffraction grating, and the CCD line sensor, cited as an example in the above embodiment may be replaced with those having equivalent functions, and of course, the present invention is not limited to these components. Although the thickness of the thin film is monitored based on the various specific equations in the above embodiment, the technical idea of the present invention lies in that the thickness of the thin film is measured in real time during surface processing based on the intensity of light reflected on the substrate surface that can be previously obtained and the theoretical formula indicating the relationship between the thickness of the thin film and the spectrum of the interference light obtained by actual measurement as described above. Therefore, a theoretical formula or the like other than those described in the above embodiment may be used within the scope of the technical idea.

REFERENCE SIGNS LIST

10 . . . Light Source
20 . . . Measurement Optical System
21 . . . Incident Optical Fiber
22 . . . Fiber Coupler
23 . . . Optical Fiber
24 . . . Collimator Lens
30 . . . Light-Dispersing Unit
31 . . . Diffraction Grating
32 . . . CCD Line Sensor
40 . . . Data Processor
41 . . . Memory
42 . . . Spectrum Obtaining Section
43 . . . Index Assigning Section
44 . . . Layer Thickness Wide-Range Estimating Section
45 . . . Index Selector
46 . . . Layer Thickness Wide-Range Estimation Result Determining Section
47 . . . Layer Thickness Determining Section
48 . . . Input Unit
49 . . . Display Unit
50 . . . Sample
51 . . . Substrate
52 . . . Resist Layer
61, 62 . . . Reflected Light

The invention claimed is:

1. A surface processing progress monitoring method for measuring a thickness of a thin film formed on a substrate which increases or decreases during surface processing using a surface processing monitoring system, including a light source, an interference optical system for generating interference light by making light reflected on a surface of the thin film and light reflected on a surface of the substrate interfere with each other, a dispersing device for wavelength-dispersing the interference light, and a measuring device for measuring, at each wavelength, and an intensity of the interference light wavelength-dispersed by the dispersing device, the surface processing progress monitoring method comprising:

a) storing in a storage an initial thickness value of the thin film, a time change rate of the thickness of the thin film during the surface processing, a thickness wide-range estimation spatial width of the thin film, a thickness wide-range estimation time interval for estimating the thickness of the thin film by using the thickness wide-range estimation spatial width, a thickness narrow-range estimation spatial width of the thin film narrower than the thickness wide-range estimation spatial width, and a thickness narrow-range estimation time interval for estimating the thickness of the thin film by using the thickness narrow-range estimation spatial width;

b) obtaining a spectrum of the interference light, using the measuring device, a predetermined number of times at a time interval equal to the thickness wide-range estimation time interval, and then obtaining a spectrum of the interference light a predetermined number of times at a time interval equal to the thickness narrow-range estimation time interval;

estimating a thickness value of the thin film within a range of the thickness wide-range estimation spatial width based on a relationship between the thickness of the thin film and an intensity of the interference light when a spectrum of the interference light is obtained for a first time, the thickness wide-range estimation spatial width including the initial thickness value; setting a plurality of candidate values for the thickness including the estimated value of the thickness of the thin film at a predetermined interval of length corresponding to a wavelength of the light source, and assigning an index for each of the candidate values for the thickness;

d) estimating further thickness values of the thin film within the range of the thickness wide-range estimation spatial width based on the relationship between the thickness of the thin film and the intensity of the interference light a spectrum of the interference light is obtained from a second time up to the predetermined number of times, the thickness wide-range estimation spatial width including the value of the thickness of the thin film previously estimated;

e) selecting one index from a plurality of the indexes based on an index selected previously at the time of obtaining a spectrum of the interference light, and a difference between a value of the thickness of the thin film estimated and a value of the thickness of the thin film estimated previously at the time of obtaining a spectrum of the interference light;

f) determining a thickness wide-range estimation result based on a result of the index selected at the predetermined number of times and the time change rate of the thickness of the thin film; and g) determining the thickness of the thin film within a range of the thickness narrow-range estimation spatial width including a value of the thickness of the thin film estimated previously at each time of obtaining a spectrum of the interference light based on the relationship between the thickness of the thin film and the intensity of the interference light after determining the thickness wide-range estimation result.

2. The surface processing progress monitoring method according to claim 1, wherein, when a wavelength of a measurement light is $\lambda$ and a refractive index of a material of the thin film material at the wavelength is $n(\lambda)$, a value of the thickness wide-range estimation spatial width is equal to or more than $\lambda/(n(\lambda))$, and a value of the thickness narrow-range estimation spatial width is less than $\lambda/(2n(\lambda))$.

3. The surface processing progress monitoring method according to claim 1, wherein, when a wavelength of a measurement light is $\lambda$ and a refractive index of a material of the thin film at the wavelength is $n(\lambda)$, the predetermined interval of length is $\lambda/(2n(\lambda))$.

4. The surface processing progress monitoring method according to claim 1, wherein, when a wavelength of a measurement light is $\lambda$ and a refractive index of a material of the thin film at the wavelength is $n(\lambda)$, a product of the time change rate of the thickness of the thin film and the thickness wide-range estimation time interval is less than $\lambda/(2n(\lambda))$.

5. The surface processing progress monitoring method according to claim 1, wherein, when the intensity of the interference light is $R_m(\lambda,t)$, a wavelength of a measurement light is $\lambda$, time is t, the intensity of the light reflected on the surface of the substrate is $R_r(\lambda)$, a coefficient corresponding to the intensity of the light reflected on the surface of the substrate and the intensity of the light reflected on the surface of the thin film surface is $\alpha_1$, a coefficient corresponding to the intensity of the interference light is $\alpha_2$, and the thickness of the thin film at the time t is T(t), wherein T(t)>0, the theoretical formula is expressed as:

$$R_m(\lambda, t) = R_r(\lambda) \cdot \left( \alpha_1 + \alpha_2 \cdot \cos\left( \frac{2T(t) \cdot n(\lambda)}{\lambda} \cdot 2\pi \right) \right). \quad \text{[Expression 1]}$$

6. The surface processing progress monitoring method according to claim 1, wherein one index from a plurality of indexes assigned for the candidate values for the thickness is selected by using a floor function in which, when a current estimated value increases by a certain value or more, the value of an index to be selected from the plurality of indexes is increased and/or a ceiling function in which, when the current estimated value decreases by the certain value or more, the value of the index to be selected from the plurality of indexes is decreased.

7. The surface processing progress monitoring method according to claim 1, wherein, when a center wavelength of a measurement light is $\lambda_c$, a refractive index of a material of the thin film at the center wavelength is $n(\lambda_c)$, the time change rate of the thickness of the thin film is $\beta$, a thickness of the thin film estimated at a last time of the predetermined number of times is $T_M$, an index selected at a last time of the predetermined number of times is $\text{Index}_M$, an index selected most is $\text{Index}_{max}$, an elapsed time after a spectrum of the interference light is obtained at a last time of the predetermined number of times is $\Delta t$, and a value $\Delta T_i \cong \lambda_c/2n(\lambda_c)$, the thickness wide-range estimation result T is calculated by:

[Expression 2]

$$T = T_M + (\text{Index}_{max} - \text{Index}_M) \times \Delta T_i + \beta \times \Delta t \quad (2).$$

* * * * *